United States Patent
Chiu

(10) Patent No.: US 10,896,848 B1
(45) Date of Patent: Jan. 19, 2021

(54) METHOD OF MANUFACTURING A SEMICONDUCTOR DEVICE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/653,975

(22) Filed: Oct. 15, 2019

(51) Int. Cl.
*H01L 21/768* (2006.01)
*H01L 23/48* (2006.01)
*H01L 23/00* (2006.01)

(52) U.S. Cl.
CPC .... *H01L 21/76898* (2013.01); *H01L 21/7682* (2013.01); *H01L 21/76831* (2013.01); *H01L 23/481* (2013.01); *H01L 24/02* (2013.01); *H01L 2224/02372* (2013.01); *H01L 2224/02375* (2013.01); *H01L 2224/02381* (2013.01)

(58) Field of Classification Search
CPC ......... H01L 21/76898; H01L 21/76831; H01L 24/02; H01L 21/7682; H01L 23/481; H01L 2224/02372; H01L 2224/02375; H01L 2224/02381
See application file for complete search history.

(56) References Cited

U.S. PATENT DOCUMENTS

| | | | | |
|---|---|---|---|---|
| 7,564,118 B2* | 7/2009 | Pogge | ................ | H01L 25/0652 257/621 |
| 9,024,390 B2* | 5/2015 | Miyajima | ......... | H01L 21/76898 257/374 |
| 9,153,559 B2* | 10/2015 | Lee | ..................... | H01L 23/3128 |
| 9,691,773 B2* | 6/2017 | Surthi | ................ | H01L 23/5222 |
| 9,786,760 B1* | 10/2017 | Bonilla | ............... | H01L 29/7827 |
| 10,312,143 B2* | 6/2019 | Migita | .................. | H01L 23/481 |
| 2005/0121768 A1* | 6/2005 | Edelstein | .......... | H01L 21/76898 257/698 |
| 2007/0167004 A1* | 7/2007 | Trezza | ................ | H01L 21/6836 438/667 |
| 2012/0068348 A1* | 3/2012 | Kirby | .................... | H01L 23/481 257/773 |
| 2013/0127019 A1* | 5/2013 | Lee | ..................... | H01L 25/0657 257/621 |
| 2013/0161825 A1* | 6/2013 | Hsu | ...................... | H01L 23/481 257/774 |
| 2013/0207267 A1* | 8/2013 | Rho | .................. | H01L 23/53238 257/751 |

(Continued)

*Primary Examiner* — John P. Dulka
(74) *Attorney, Agent, or Firm* — CKC & Partners Co., LLC

(57) ABSTRACT

A method of manufacturing a semiconductor device includes forming a precursor structure including a substrate having a via hole, a liner on a sidewall of the via hole, a conductor in the via hole, a first and a second insulating layers respectively on the top and bottom surfaces, and a first and a second redistribution layers in contact with the conductor through a first hole in the first insulating layer and a second hole in the second insulating layer. A first opening and a second opening are then respectively formed in the first insulating layer and the second insulating layer to expose a portion of the liner. The liner is then etched through the first opening and the second opening to form an air gap surrounding the conductor. The first opening and the second opening are then filled to seal the air gap.

10 Claims, 14 Drawing Sheets

(56) References Cited

U.S. PATENT DOCUMENTS

| | | | |
|---|---|---|---|
| 2013/0221494 A1* | 8/2013 | Ramachandran | ............................ H01L 21/76831 257/621 |
| 2014/0027908 A1* | 1/2014 | Tsai | ..................... H01L 23/5226 257/751 |
| 2014/0048939 A1* | 2/2014 | Park | .................. H01L 21/76832 257/751 |
| 2014/0231892 A1* | 8/2014 | Song | ................. H01L 21/76897 257/296 |
| 2014/0264903 A1* | 9/2014 | Chen | .................... H01L 21/7681 257/774 |
| 2015/0035050 A1* | 2/2015 | Yeom | ................. H01L 21/76897 257/330 |
| 2015/0091186 A1* | 4/2015 | Yang | ..................... H01L 23/481 257/774 |
| 2015/0102496 A1* | 4/2015 | Zhang | ............... H01L 23/53295 257/774 |
| 2015/0162277 A1* | 6/2015 | Zhang | ............... H01L 23/53295 257/773 |
| 2015/0287628 A1* | 10/2015 | You | .................... H01L 21/76837 257/774 |
| 2016/0240428 A1* | 8/2016 | Tung | ................. H01L 21/02266 |
| 2017/0200632 A1* | 7/2017 | Chang | ................... H01L 23/535 |
| 2018/0061708 A1* | 3/2018 | Briggs | ............. H01L 21/76864 |
| 2019/0267248 A1* | 8/2019 | Chen | ................ H01L 21/31116 |
| 2020/0006228 A1* | 1/2020 | Yang | ............... H01L 21/823481 |
| 2020/0098561 A1* | 3/2020 | Nozawa | ............ H01L 21/02118 |
| 2020/0118866 A1* | 4/2020 | Patlolla | ............. H01L 21/76831 |
| 2020/0235220 A1* | 7/2020 | Liao | ...................... H01L 29/518 |

\* cited by examiner

METHOD OF MANUFACTURING A SEMICONDUCTOR DEVICE

BACKGROUND

Field of Invention

The present invention relates to a method of manufacturing a semiconductor device.

Description of Related Art

In the 3D integration technology, two or more wafers (or chips) are bonded with conductive pads, and through silicon via (TSV) electrodes are then formed to interconnect conductive pads on the first and second wafers. The TSV electrode is usually made of copper or other conductive material to provide electrical connections between conductive pads. However, the existence of the TSV parasitic capacitance is a key to impact the electrical characteristic. Thus, further improvements are needed to reduce the parasitic capacitance and enhance performance of semiconductor device.

SUMMARY

In accordance with an aspect of the present invention, a method of manufacturing a semiconductor device is provided. The method includes following operations. A precursor structure is formed. The precursor structure includes a substrate having a top surface, a bottom surface, and a via hole penetrating the substrate; a liner on a sidewall of the via hole, the top surface and the bottom surface of the substrate; a conductor in the via hole; a seed layer between the liner and the conductor; a first insulating layer and a second insulating layer respectively on the top surface and the bottom surface of the substrate, wherein the first insulating layer and the second insulating layer respectively have a first hole and a second hole exposing the conductor; and a first redistribution layer and a second redistribution layer respectively in contact with the conductor through the first hole and the second hole. A first opening and a second opening are then respectively formed in the first insulating layer and the second insulating layer to expose a portion of the liner. The liner is then etched through the first opening and the second opening to form an air gap surrounding the conductor. The first opening and the second opening are then filled to seal the air gap.

According to some embodiments of the present invention, the conductor has a first surface, the liner on the top surface of the substrate has an upper surface, and the first surface is level with the upper surface.

According to some embodiments of the present invention, the conductor has a diameter, the liner on the top surface of the substrate has a first length, and the first length is about ½-⅓ of the diameter.

According to some embodiments of the present invention, the first redistribution layer and the second redistribution layer collectively clamp the conductor.

According to some embodiments of the present invention, the first redistribution layer has a lateral portion extending in a first direction on the first insulating layer, and the second redistribution layer has a lateral portion extending in a second direction opposite to the first direction.

According to some embodiments of the present invention, the first opening has a continuous pattern around the first redistribution layer located on the first hole, and the second opening has a continuous pattern around the second redistribution layer located under the second hole in a top view.

According to some embodiments of the present invention, the first opening includes a plurality of separate sections around the first redistribution layer located on the first hole, and the second opening includes a plurality of separate sections around the second redistribution layer located under the second hole in a top view.

According to some embodiments of the present invention, the conductor is electrically connected to the first redistribution layer and the second redistribution layer.

According to some embodiments of the present invention, the air gap separates the conductor from the substrate.

According to some embodiments of the present invention, forming the precursor structure includes: forming a recess in a semiconductor substrate from a front side of the semiconductor substrate; forming a first liner layer, a seed material layer, and the conductor on the semiconductor substrate and in the recess; patterning the first liner layer by a first photoresist mask; forming the first insulating layer on the semiconductor substrate; forming the first redistribution layer on the first insulating layer and in the first hole; thinning down the semiconductor substrate from a back side of the semiconductor substrate to expose the conductor; forming a second patterned liner layer on the back side by a second photoresist mask; forming the second insulating layer under the substrate; and forming the second redistribution layer under the second insulating layer and in the second hole.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Although below using a series of actions or steps described in this method disclosed, but the order of these actions or steps shown should not be construed to limit the present invention. For example, certain actions or steps may be performed in different orders and/or concurrently with other steps. Moreover, not all steps must be performed in order to achieve the depicted embodiment of the present invention. Furthermore, each operation or procedure described herein may contain several sub-steps or actions.

Figure 1:
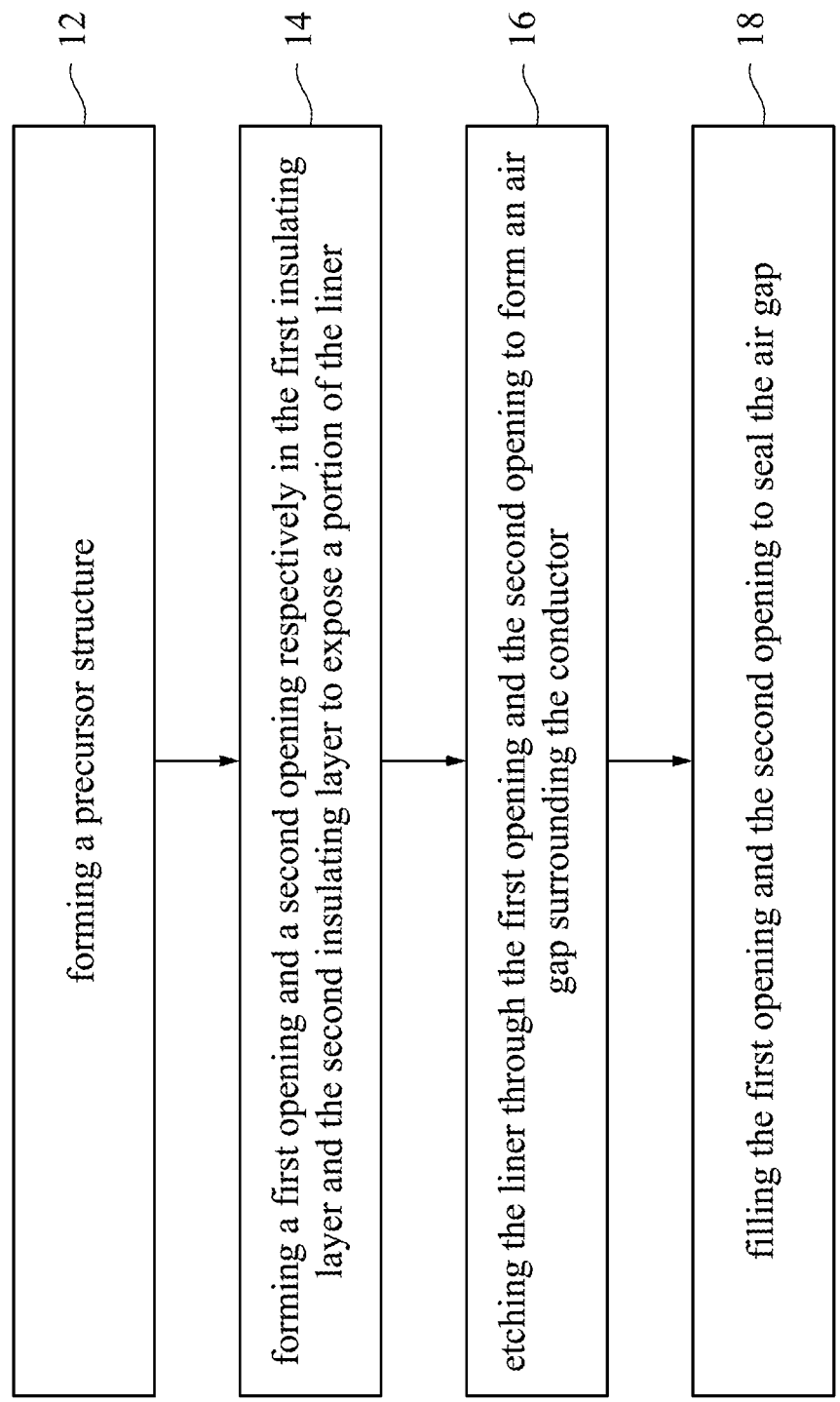
FIG. 1 is a flow chart illustrating a method of manufacturing a semiconductor device in accordance with some embodiments of this invention.

FIG. 1 is a flow chart illustrating a method of manufacturing a semiconductor device in accordance with some embodiments of this invention. As shown in FIG. 1, the method 10 includes operation 12, operation 14, operation 16, and operation 18. FIGS. 2-14 are respectively cross-sectional views and top views at various stages of method 10 according to some embodiments of the present disclosure.

Please refer to FIG. 1, in the operation 12 of the method 10, a precursor structure is formed. FIGS. 2-11 illustrate the detail steps of implementing operation 12 in accordance with an embodiment of the present disclosure.

Figure 2:
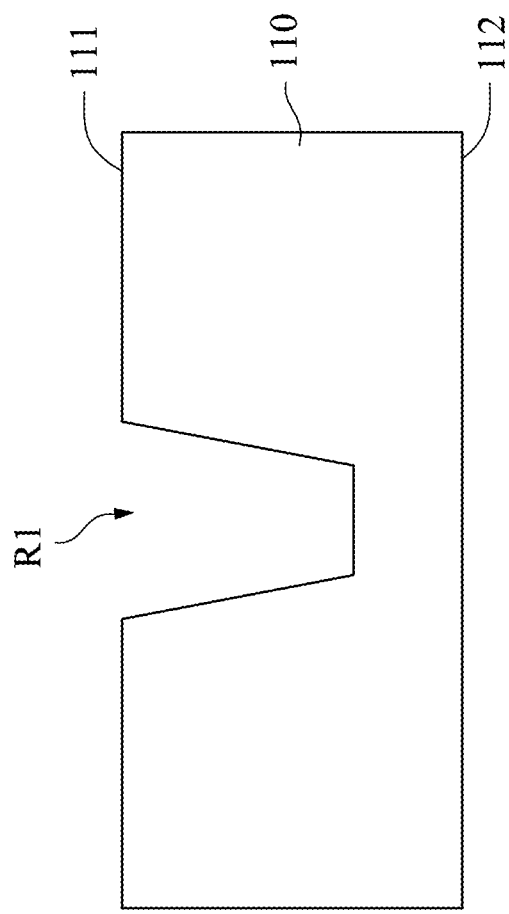
FIG. 2 illustrates a cross-sectional view of a semiconductor device at different stages of manufacturing processes in accordance with some embodiments.

Please refer to FIG. 2, a recess R1 is formed in a semiconductor substrate 110 from a top surface 111 of the semiconductor substrate 110. As shown in FIG. 2, the semiconductor substrate 110 has a top surface 111 and a bottom surface 112 opposite to the top surface 111. In some embodiments, the recess R1 has an inclined sidewall, as illustrated in FIG. 2. In other embodiments, the recess R1 has a vertical sidewall.

In some embodiments, the semiconductor substrate 110 may be a bulk silicon substrate. Alternatively, the semiconductor substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. Further, the semiconductor substrates 110 may also include a silicon-on-insulator (SOI) substrate. Generally, an SOI substrate includes a layer of a semiconductor material such as silicon (Si), germanium (Ge), silicon germanium (SiGe), silicon germanium on insulator (SGOI), or a combination thereof. In some embodiments, the semiconductor substrate 110 further includes one or more active device (not shown) such as transistor.

Figure 3:
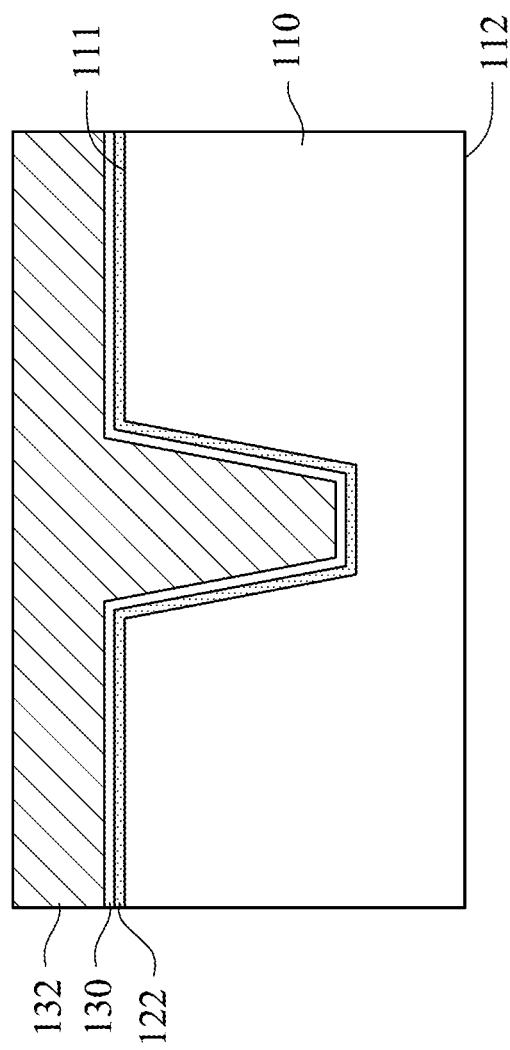
FIG. 3 illustrates a cross-sectional view of a semiconductor device at different stages of manufacturing processes in accordance with some embodiments.

Please refer to FIG. 3, a first liner layer 122, a seed material layer 130, and a conductive layer 132 are formed on the semiconductor substrate 110 and in the recess R1. As shown in FIG. 3, the first liner layer 122, the seed material layer 130, and the conductive layer 132 are comformally formed on the semiconductor substrate 110 in sequence.

In some embodiments, the first liner layer 122 may include any suitable material, such as silicon oxide, but is not limited thereto. In some embodiments, the seed material layer 130 is composed of a single-layer or a stack of metal layers of different materials selected from a group consisting of chromium (Cr), Titanium (Ti), copper (Cu), silver (Ag), and a combination thereof. In some embodiments, the conductive layer 132 includes conductive material such as copper.

Figure 4:
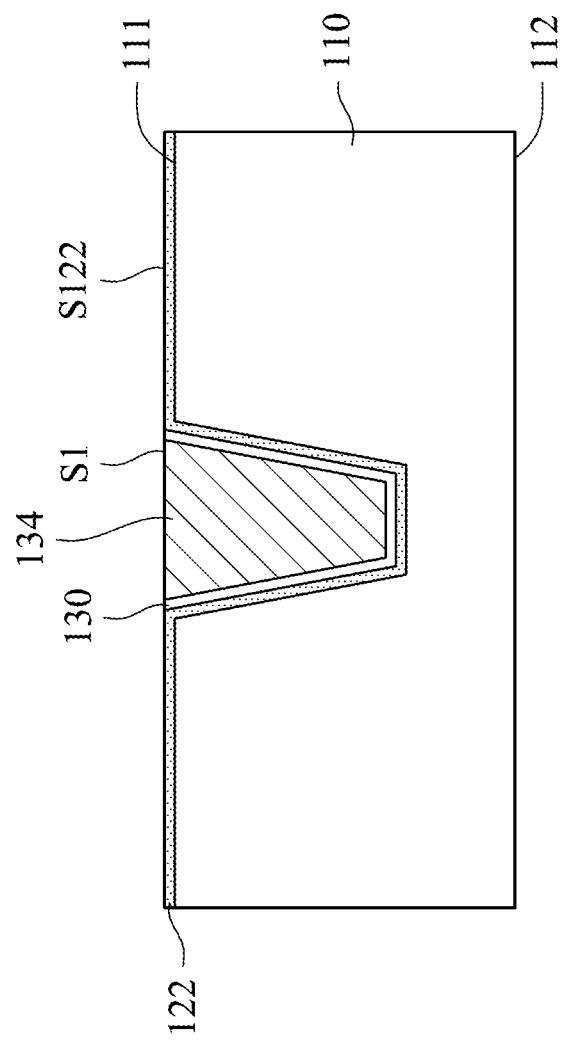
FIG. 4 illustrates a cross-sectional view of a semiconductor device at different stages of manufacturing processes in accordance with some embodiments.

Please refer to FIG. 4, a planarization process is performed to form a in the recess R1. As shown in FIG. 4, the conductor 134 has a first surface S1, the first liner layer 122 has an upper surface S122, and the first surface S1 is level with the upper surface S122. In some embodiments, the planarization process includes any suitable process such as chemical mechanical polishing (CMP), but is not limited thereto. The conductor 134 may function as through silicon via (TSV) electrode, but is not limited thereto.

Figure 5A:
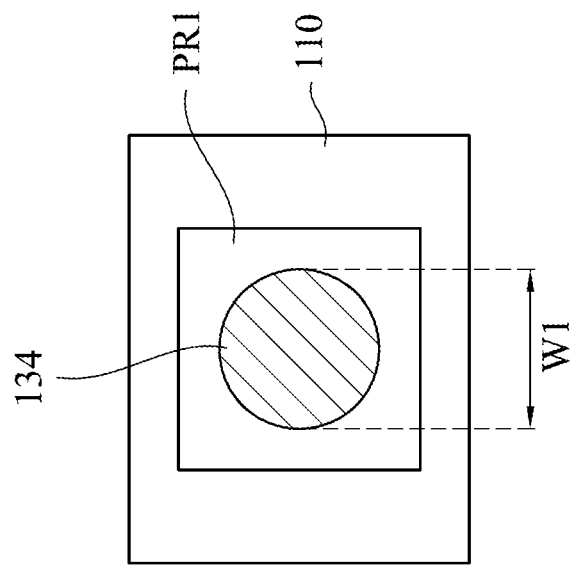
FIG. 5A and FIG. 5B illustrate respectively a cross-sectional view and a top view of a semiconductor device at different stages of manufacturing processes in accordance with some embodiments.
Figure 5B:
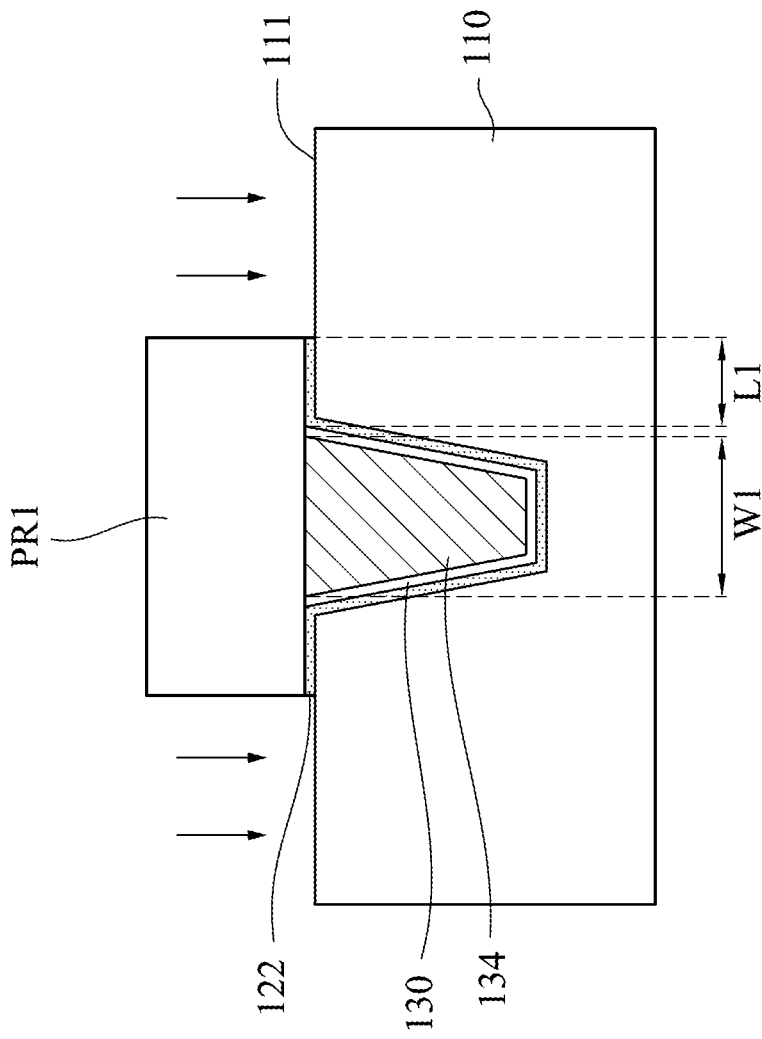

Please refer to FIGS. 5A and 5B, the first liner layer 122 is patterned by a first photoresist mask PR1. FIG. 5B is a top view of FIG. 5A, and the seed material layer 130 is not shown in FIG. 5B for simplifying the drawing. As shown in FIGS. 5A and 5B, a portion of the first liner layer 122 on the top surface 111 of the semiconductor substrate 110 is etched. In some embodiments, the conductor 134 has a diameter W1, the patterned first liner layer 122 has a first length L1, and the first length L1 is about ½-⅓ of the diameter.

Figure 6:
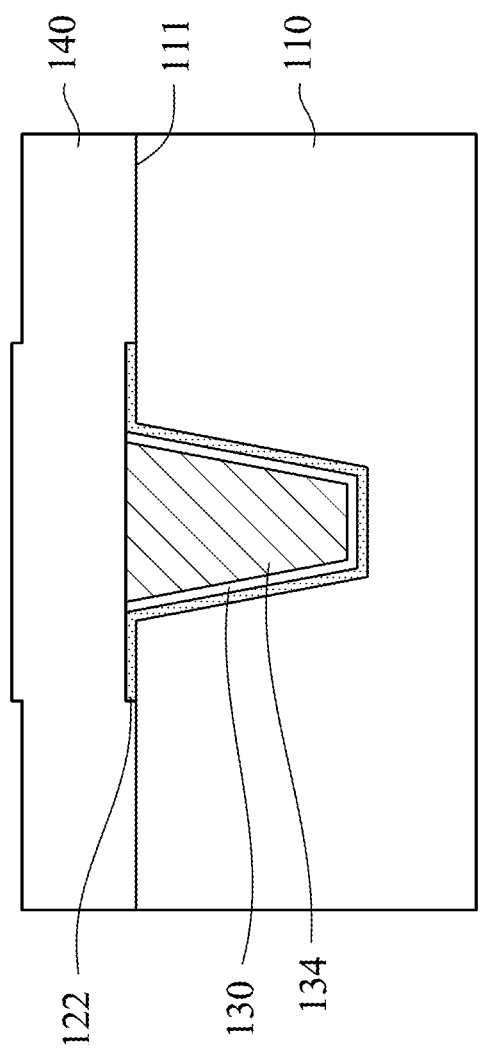
FIG. 6 illustrates a cross-sectional view of a semiconductor device at different stages of manufacturing processes in accordance with some embodiments.

Please refer to FIG. 6, a first insulating layer 140 is formed on the semiconductor substrate 110. In some embodiments, the first insulating layer 140 is comformally formed on the semiconductor substrate 110 and covers the patterned first liner layer 122 and conductor 134. The first insulating layer 140 may be deposited by any suitable process such as, but not limited to, chemical vapor deposition (CVD), physical vapor deposition (PVD), atomic layer deposition (ALD), plasma enhanced chemical vapor deposition (PECVD), and a combination thereof. In some embodiments, the first insulating layer 140 includes silicon nitride, but is not limited thereto. The first insulating layer 140 may function as an etch stop layer.

Figure 7:
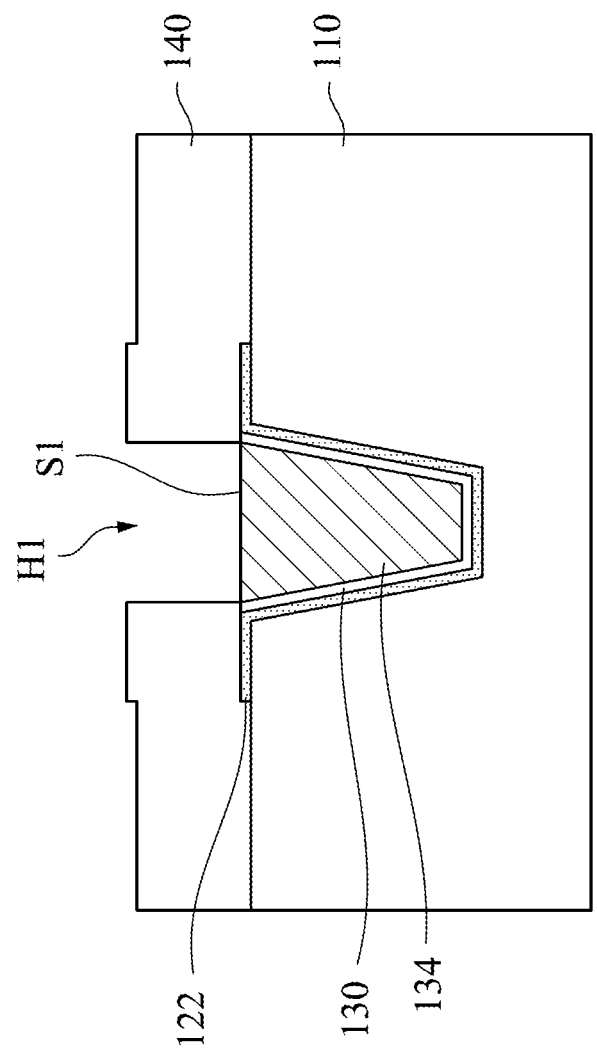
FIG. 7 illustrates a cross-sectional view of a semiconductor device at different stages of manufacturing processes in accordance with some embodiments.

Please refer to FIG. 7, a first hole H1 is formed in the first insulating layer 140. As shown in FIG. 7, the first hole H1 is formed on the conductor 134 to expose the first surface S1 of the conductor 134. The first hole H1 may be formed by photolithography process and etching process.

Figure 8B:
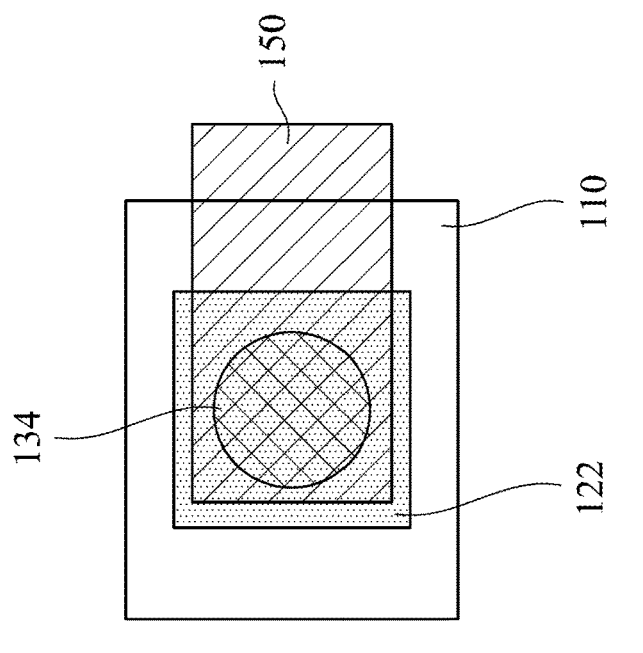
FIG. 8A and FIG. 8B illustrate respectively a cross-sectional view and a top view of a semiconductor device at different stages of manufacturing processes in accordance with some embodiments.
Figure 8A:
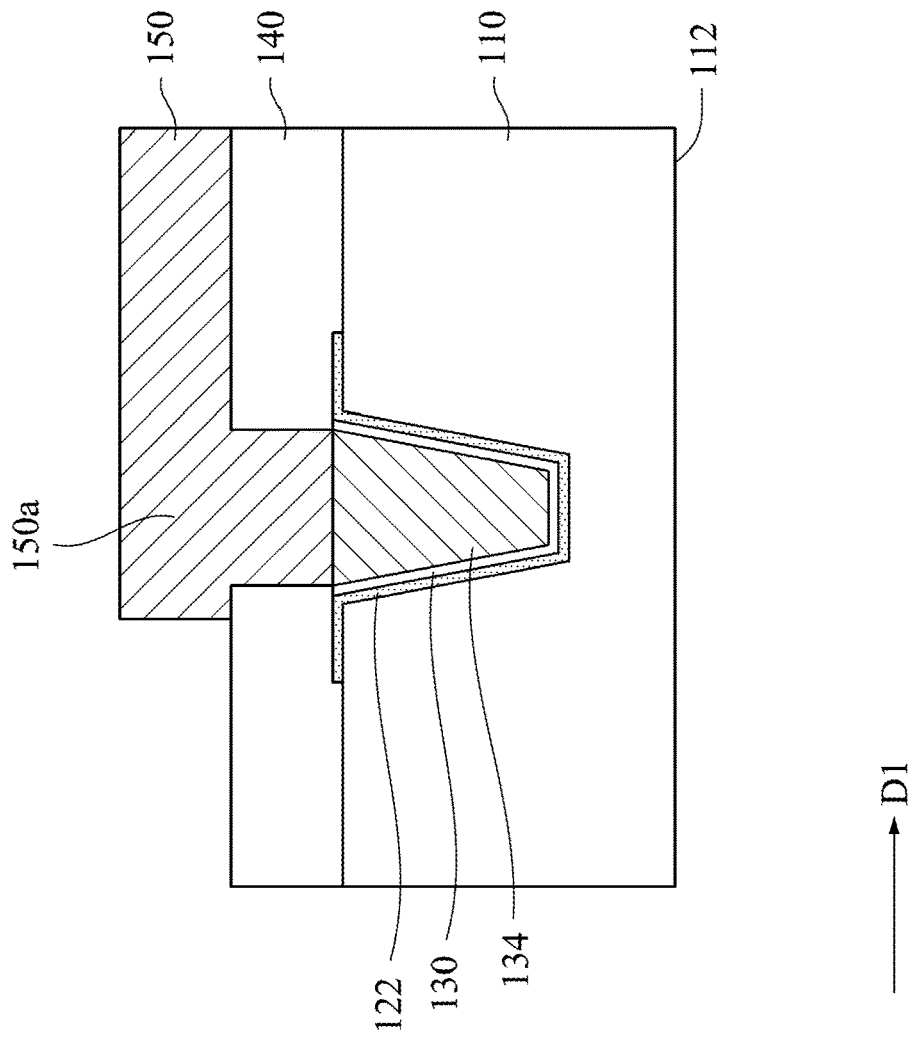

Please refer to FIG. 8A and FIG. 8B, a first redistribution layer 150 is formed on the first insulating layer 140 and in the first hole H1. FIG. 8B is a top view of FIG. 8A, and the seed material layer 130 is not shown in FIG. 8B for simplifying the drawing. As shown in FIG. 8A, the first redistribution layer 150 is filled in the first hole H1 (shown in FIG. 7) and has a lateral portion 150a extending from the first hole H1 in a first direction D1 on the first insulating layer 140. In some embodiments, the first insulating layer 140 includes silver (Ag), copper (Cu), tungsten (W), titanium (Ti), tantalum (Ta), aluminum (Al), nickel (Ni), ruthenium (Ru), palladium (Pd), platinum (Pt), Manganese (Mn), tungsten nitride (WN), titanium nitride (TiN), tantalum nitride (TaN), aluminum nitride (AlN), tungsten silicide (WSi), molybdenum nitride (MoN), nickel silicide ($Ni_2Si$), titanium silicide ($TiSi_2$), titanium aluminide (TiAl), arsenic (As) doped polycrystalline silicon, zirconium nitride (ZrN), TaC, TaCN, TaSiN, TiAlN, and or combination thereof.

Figure 9:
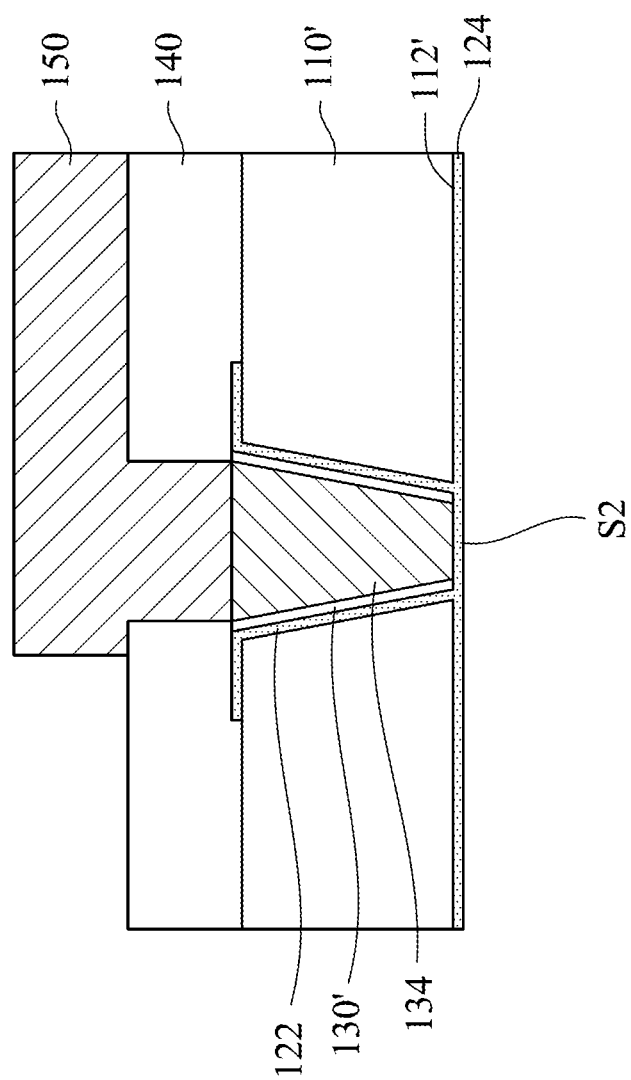
FIG. 9 illustrates a cross-sectional view of a semiconductor device at different stages of manufacturing processes in accordance with some embodiments.

Please refer to FIG. 9, the semiconductor substrate 110 is thinned down from a back side of the semiconductor substrate 110 to expose a bottom surface S2 of the conductor 134. In some embodiments, a thinning process, such as chemical mechanical polish (CMP), grinding, or etching, is performed to thin down the semiconductor substrate 110. As shown in FIG. 9, the substrate 110' is formed after the thinning process. A bottom surface 112' of the substrate 110' may be level with the second surface S2 of the conductor 134.

Still referring to FIG. 9, a second liner layer 124 is formed on the bottom surface 112' of the substrate 110'. In some embodiments, the material and the formation method of the second liner layer 124 may be substantially same as the first liner layer 122, and will not be repeated hereinafter.

Figure 10:
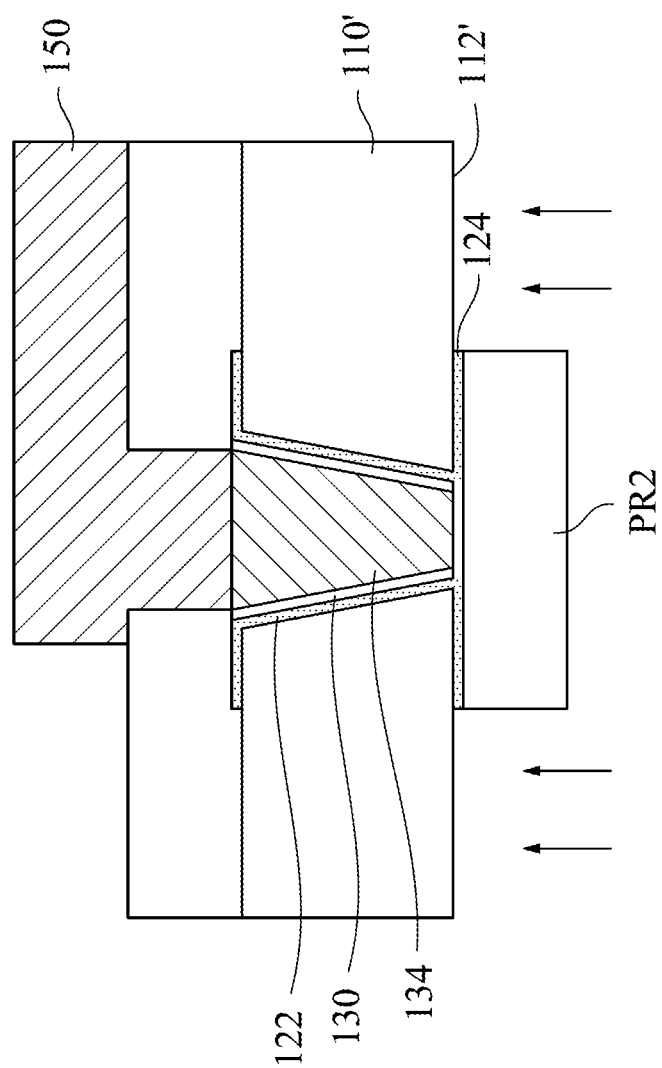
FIG. 10 illustrates a cross-sectional view of a semiconductor device at different stages of manufacturing processes in accordance with some embodiments.

Please refer to FIG. 10, a patterned second liner layer 124 is formed on the bottom surface 112' by a second photoresist mask PR2. As shown in FIG. 10, a portion of the second liner layer 124 under the bottom surface 112' of the substrate 110' is etched to form the patterned second liner layer 124. In some embodiments, the formation of the patterned second liner layer 124 is same as the formation of the patterned first liner layer 122 shown in FIG. 5A. That is, a length of the patterned second liner layer 124 may have a second length (not shown) may be about ½-⅓ of a diameter of the conductor 134.

Figure 11:
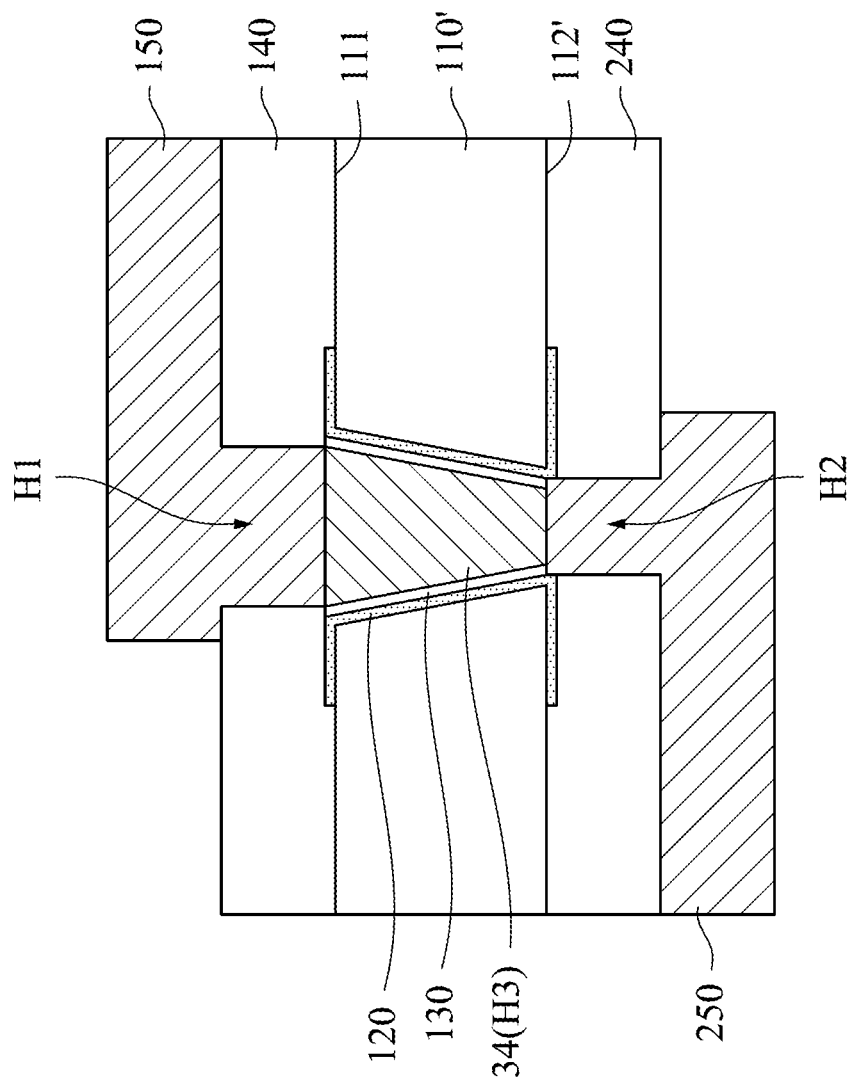
FIG. 11 illustrates a cross-sectional view of a semiconductor device at different stages of manufacturing processes in accordance with some embodiments.

Please refer to FIG. 11, a second insulating layer 240 is formed under the substrate 110'. In some embodiments, the material and the formation of the second insulating layer 240 is substantially same as the first insulating layer 140. As shown in FIG. 11, a second hole H2 is formed in the second insulating layer 240 to expose the second surface of the conductor 134. Specifically, the second hole H2 in the second insulating layer 240 is aligned with the first hole H1 in the first insulating layer 140, and the conductor 134 is between thereof.

Still referring to FIG. 11, a second redistribution layer 250 is formed under the second insulating layer 240 and in the second hole H2. Similarly, the material and the formation of the second redistribution layer 250 may be substantially same as the first redistribution layer 150 in some embodiments. In some embodiments, the second redistribution layer 250 has a lateral portion 250a extending from the second hole H2 in a direction opposite to the first direction D1 show in FIG. 8A. In some embodiments, when the structure shown in FIG. 11 is flipped upside down, a top-down view may be substantially same as or equal to the top view shown in FIG. 8A.

As shown in FIG. 11, the precursor structure 101 is thus formed. The precursor structure 101 includes a substrate 110', a liner 120, a conductor 134, a seed layer 130', a first insulating layer 140, a second insulating layer 240, a first redistribution layer 150, and a second redistribution layer 250. The substrate 110' has a top surface 111, a bottom surface 112', and a via hole H3 penetrating the substrate 110'. The liner 120 is on a sidewall of the via hole H3. The liner 120 is further on a portion of the top surface 111 and a portion of the bottom surface 112' of the substrate 110'. The conductor 134 is in the via hole H3. The seed layer 130' is between the liner 120 and the conductor 134. The first insulating layer 140 and the second insulating layer 240 are respectively on the top surface 111 and the bottom surface 112' of the substrate 110'. The first insulating layer 140 and the second insulating layer 240 respectively have a first hole H1 and a second hole H2 exposing the conductor 134. The first redistribution layer 150 and the second redistribution layer 250 are respectively in contact with the conductor 134 through the first hole H1 and the second hole H2.

Figure 12B:
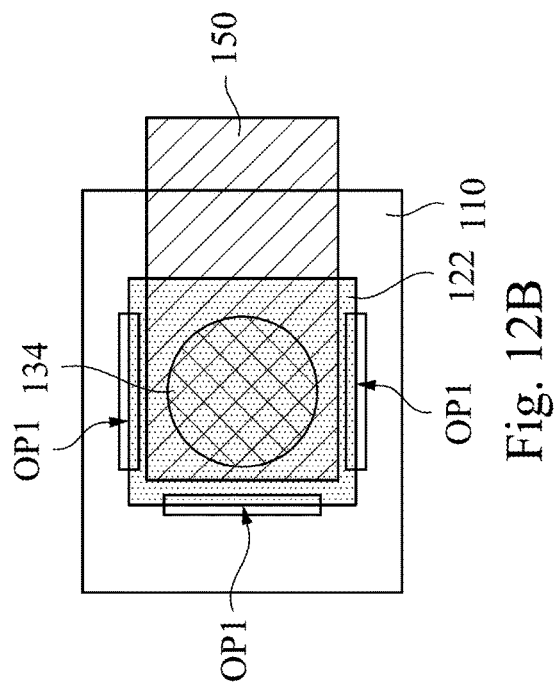
FIG. 12A to FIG. 12C illustrate respectively a cross-sectional view and a top view of a semiconductor device at different stages of manufacturing processes in accordance with some embodiments.

Next, please refer to FIG. 1 and FIGS. 12A-12C, in the operation 14 of the method 10, a first opening OP1 and a second opening OP2 is respectively formed in the first insulating layer 140 and the second insulating layer 240 to expose a portion of the liner 120. Referring to FIG. 12B, which is a top view of FIG. 12A in accordance with one embodiment of the present disclosure. In some embodiments, the first opening OP1 includes a plurality of separate sections around the first redistribution layer 150 located on the first hole H1. For example, as illustrate in FIG. 12B, the first opening OP1 may be composed of three sections, and each of the sections is adjacent to an edge of the first redistribution layer 150. Similarly, the second opening OP2 may include a plurality of separate sections around the second redistribution layer 250 located under the second hole H2 in a top view. Therefore, an arrangement of the second opening OP2 may be substantially same as the first opening OP1 shown in FIG. 12B.

Figure 12C:
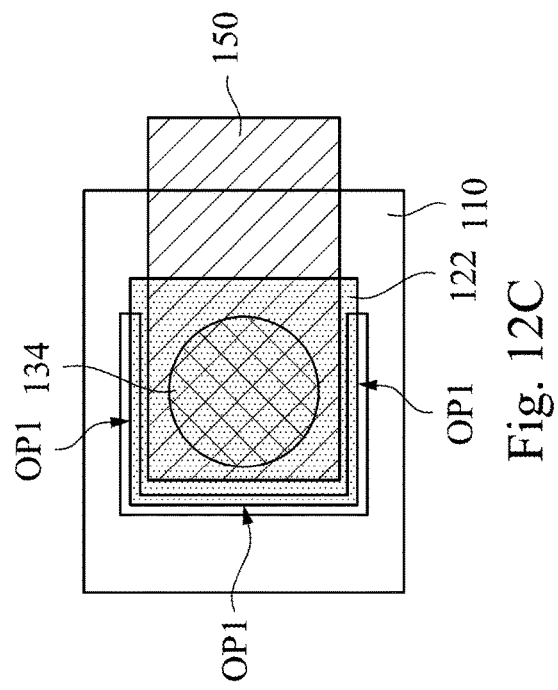
Figure 12A:
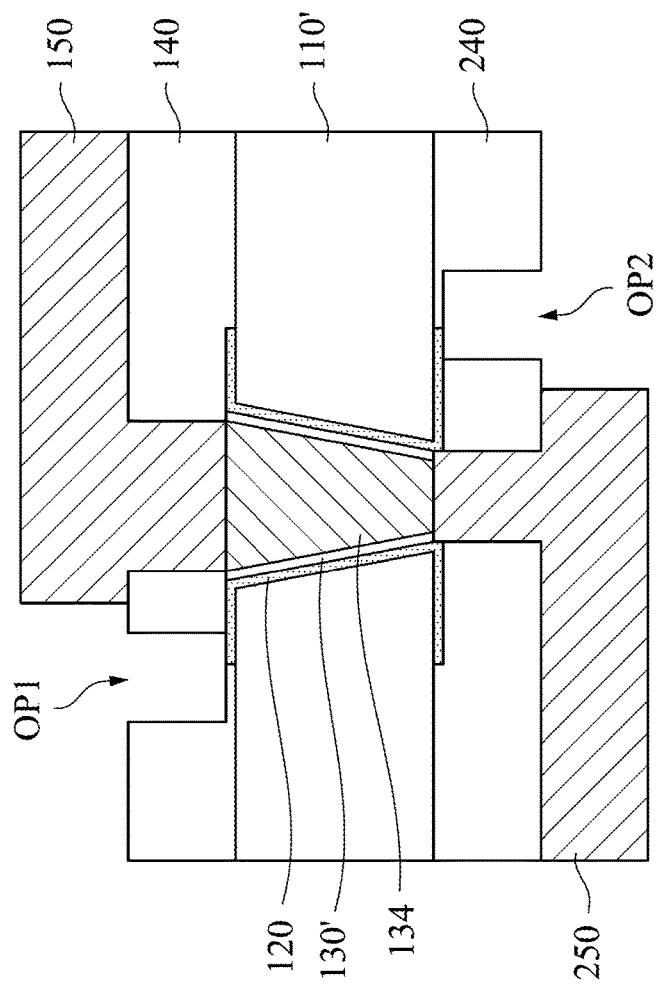

Please refer to FIG. 12C, which is a top view of FIG. 12A in accordance with another embodiment of the present disclosure. As shown in FIG. 12C, the first opening OP1 may have a continuous pattern around the first redistribution layer 150 located on the first hole H1. For example, the first opening OP1 may be a continuous trench adjacent to the edges of the first redistribution layer 150. Similarly, the second opening OP2 may have a continuous pattern around the second redistribution layer 250 located under the second hole H2 in a top view. Therefore, an arrangement of the second opening OP2 may be substantially same as the first opening OP1 shown in FIG. 12C.

Figure 13:
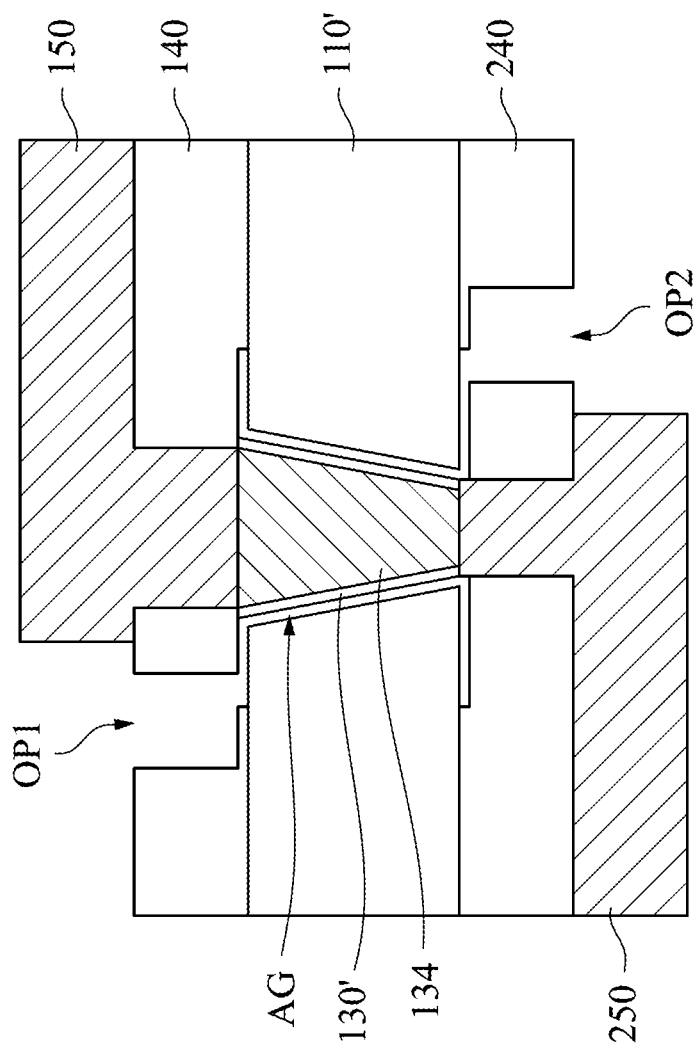
FIG. 13 illustrates a cross-sectional view of a semiconductor device at different stages of manufacturing processes in accordance with some embodiments.

Next, referring to FIG. 1 and FIG. 13, in the operation 16 of the method 10, the liner 120 is etched through the first opening OP1 and the second opening OP2 to form an air gap AG surrounding the conductor 134a. In some embodiments, the liner 120 is etched by using etching solution such as acid to etch from the first opening OP1 and the second opening OP2. Specifically, the first opening OP1 and the second opening OP2 may be an entrance for the acid to remove the liner 120. As shown in FIG. 13, the liner 120 shown in FIG. 12A is thus replaced by the air gap AG. The air gap AG wraps the conductor 134 and the seed layer 130'. The conductor 134 is supported by the first redistribution layer 150 and the second redistribution layer 250, such that the conductor 134 may not drop off when removing the liner 120.

Figure 14:
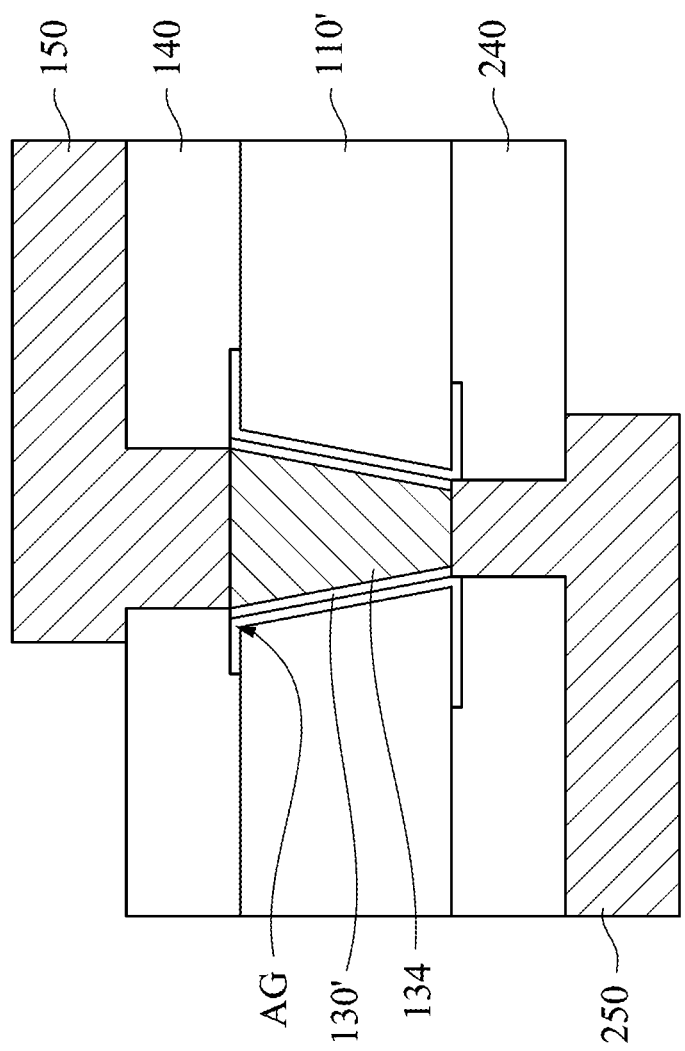
FIG. 14 illustrates a cross-sectional view of a semiconductor device at different stages of manufacturing processes in accordance with some embodiments.

Next, referring to FIG. 1 and FIG. 14, in the operation 18 of the method 10, the first opening OP1 and the second opening OP2 are filled to seal the air gap AG. In some embodiments, the first opening OP1 and the second opening OP2 are filled with material same as the first insulating layer 140 and the second insulating layer 240. The air gap AG can be easily enclosed by any suitable deposition process. As shown in FIG. 14, the semiconductor device 100 is thus formed. The first redistribution layer 150 and the second redistribution layer 250 collectively clamp the conductor 134. Further, the conductor 134 is electrically connected to the first redistribution layer 150 and the second redistribution layer 250. The air gap AG separates the conductor 134 and the seed layer 130' from the substrate 110'. Further, the air gap AG electrically insulated the conductor 134 and the seed layer 130' from the substrate 110'. It is noted that the air gap AG are not necessarily filled with air, it may be filled with other types of gases, or may be vacuumed.

According to the embodiments of the present disclosure, a method of manufacturing a semiconductor device is provided. The method disclosed herein forming an air gap surrounding a conductor, and the conductor is clamped by a first redistribution layer and a second redistribution layer. The conductor may be further surrounded by a seed layer. Therefore, the air gap insulates the conductor and the seed layer from the surrounding elements. The air gap can reduce a parasitic capacitance, such that the overall electric performance of the semiconductor device can be improved. For example, the capacitance density and leakage current density of the semiconductor device with air gap are respectively about one order and two orders lower in magnitude than a conventional semiconductor device using silicon oxide as an insulator.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor device, comprising:
   forming a precursor structure comprising:
      a substrate having a top surface, a bottom surface, and a via hole penetrating the substrate;
      a liner on a sidewall of the via hole, the top surface and the bottom surface of the substrate;
      a conductor in the via hole;
      a seed layer between the liner and the conductor;
      a first insulating layer and a second insulating layer respectively on the top surface and the bottom surface of the substrate, wherein the first insulating layer and the second insulating layer respectively have a first hole and a second hole exposing the conductor; and
      a first redistribution layer and a second redistribution layer respectively in contact with the conductor through the first hole and the second hole;
   forming a first opening and a second opening respectively in the first insulating layer and the second insulating layer to expose a portion of the liner;
   etching the liner through the first opening and the second opening to form an air gap surrounding the conductor; and
   filling the first opening and the second opening to seal the air gap.

2. The method of claim 1, wherein the conductor has a first surface, the liner on the top surface of the substrate has an upper surface, and the first surface is level with the upper surface.

3. The method of claim 2, wherein the conductor has a diameter, the liner on the top surface of the substrate has a first length, and the first length is about ½-⅓ of the diameter.

4. The method of claim 1, wherein the first redistribution layer and the second redistribution layer collectively clamp the conductor.

5. The method of claim 1, wherein the first redistribution layer has a lateral portion extending in a first direction on the first insulating layer, and the second redistribution layer has a lateral portion extending in a second direction opposite to the first direction.

6. The method of claim 1, wherein the first opening has a continuous pattern around the first redistribution layer located on the first hole, and the second opening has a continuous pattern around the second redistribution layer located under the second hole in a top view.

7. The method of claim 1, wherein the first opening includes a plurality of separate sections around the first redistribution layer located on the first hole, and the second opening includes a plurality of separate sections around the second redistribution layer located under the second hole in a top view.

8. The method of claim 1, wherein the conductor is electrically connected to the first redistribution layer and the second redistribution layer.

9. The method of claim 1, wherein the air gap separates the conductor from the substrate.

10. The method of claim 1, wherein forming the precursor structure comprises:
   forming a recess in a semiconductor substrate from a front side of the semiconductor substrate;
   forming a first liner layer, a seed material layer, and the conductor on the semiconductor substrate and in the recess;
   patterning the first liner layer by a first photoresist mask;
   forming the first insulating layer on the semiconductor substrate;
   forming the first redistribution layer on the first insulating layer and in the first hole;
   thinning down the semiconductor substrate from a back side of the semiconductor substrate to expose the conductor;
   forming a patterned second liner layer on the back side by a second photoresist mask;
   forming the second insulating layer under the substrate; and
   forming the second redistribution layer under the second insulating layer and in the second hole.

* * * * *